United States Patent [19]

Hill

[11] Patent Number: 4,608,095
[45] Date of Patent: Aug. 26, 1986

[54] GETTERING

[75] Inventor: Dale E. Hill, Kirkwood, Mo.

[73] Assignee: Monsanto Company, St. Louis, Mo.

[21] Appl. No.: 719,780

[22] Filed: Apr. 4, 1985

Related U.S. Application Data

[63] Continuation of Ser. No. 466,249, Feb. 14, 1983, abandoned.

[51] Int. Cl.$^4$ ........................................... H01L 21/324
[52] U.S. Cl. .................................... 148/33; 148/33.3; 148/DIG. 60; 29/571; 56/DIG. 66
[58] Field of Search ............... 29/571, 576 T; 148/33, 148/33.3, 33.4, 174, 175, DIG. 60; 156/DIG. 66

[56]   References Cited

U.S. PATENT DOCUMENTS 4,053,335  10/1977  Hu ....................................... 148/1.5

OTHER PUBLICATIONS

Craven et al, "Internal Gettering in Silicon", Solid State Technology, Jul. 1981, pp. 55-61.

Primary Examiner—Brian E. Hearn
Assistant Examiner—David A. Hey
Attorney, Agent, or Firm—Paul L. Passley

[57]   ABSTRACT

Semiconductor substrate materials, such as silicon, useful in the manufacture of electronic devices, such as integrated circuits, employing low temperature, i.e., below 1025° C. processing cycles are provided with a 0.05 to 2.0 micron thick layer of polysilicon on the backside to improve gettering capabilities of defects, contaminants and impurities away from the active device region of the substrate.

17 Claims, No Drawings

GETTERING

This is a continuation, of application Ser. No. 466,249, filed Feb. 14, 1983 abandoned.

BACKGROUND OF THE INVENTION

1. Field of the Invention

This invention relates to the manufacture of electronic devices such as integrated circuits. Particularly, this invention relates to improved semiconductor substrate materials, such as silicon wafers, used in the manufacture of integrated circuit devices. Specifically, this invention is directed to semiconductor substrate materials having enhanced ability for gettering deleterious impurities, contaminants and defects during device manufacture away from the region of device formation.

In the manufacture of integrated circuit devices on silicon wafers, the presence of and introduction of defects, contaminants and impurities on and near the device formation surface of the wafer creates excessive current leakages which greatly affects the yield of usable devices obtained. The art has recognized that the deleterious defects, contaminants and impurities can be to some extent relocated to non-harmful regions in the substrate material away from the device formation region. The methods and processes for diffusing and trapping the defects, contaminants and impurities away from the active device region both prior to and during device formation are termed gettering in the electronics industry and art.

2. Description of the Prior Art

Several techniques and processes for gettering in semiconductor materials to improve device yields have been disclosed in the art. Known gettering techniques and processes for semiconductor materials can be generally classified as based on external or internal means.

External gettering involves modifying the backside surface of the wafer to provide sites to which the defects, contaminants and impurities are attracted. A present commercially used external gettering technique is to introduce mechanical damage to the backside of the wafer. The mechanical damage is imparted to the backside of the wafer by scratching the surface or sanding or grinding with an abrasive means to alter the crystalline structure and impart imperfections which attract and trap defects, contaminants and impurities away from the active device region of the wafer. Although backside damaged wafers provide gettering, the damage to the wafer creates additional problems in fragility, handling and cleaning to remove particulates formed and the damaged area provides potential traps for holding fluids and materials employed in the device manufacturing process which can result in further wafer contamination. U.S. Pat. No. 4,144,099 describes wafer gettering by employing backside mechanical damage.

Another example of external gettering is described in U.S. Pat. No. 3,997,368 wherein a stressed layer of silicon nitride or aluminum oxide is formed on the backside of the wafer which is then annealed to cause stacking fault nucleation sites to diffuse to the backside. Still another example is described in U.S. Pat. No. 3,929,529 wherein a surface of the wafer is anodized to form a layer of porous silicon, the contaminants are diffused from the body of the wafer to the porous silicon and the porous silicon layer is then oxidized to silicon dioxide.

U.S. Pat. No. 4,053,335 discloses a means of external gettering in semiconductor materials by providing a layer of polysilicon on the backside of the wafer. The grain boundaries of the polysilicon provide sites for segregation of impurities from the substrate. As the polysilicon grain boundaries are not annealed out a high temperature, the gettering capabilities remain effective throughout high temperature processing used in device manufacture.

Other commonly employed external type gettering means utilize boron- or phosphorus-doped semiconductor materials, ion implantation, such as argon, or heavy diffusion of impurities, such as boron and phosphorus, into the substrate material. U.S. Pat. No. 3,874,936 provides a description of the latter technique.

More recently, the gettering effect of oxygen contained in the substrate material has been reported in "Solid State Technology", July 1981, pages 55–61, and is referred to as internal gettering. Oxygen is present in Czochralski grown silicon as it is introduced to the crystal from the dissolution of the quartz crucible employed to hold the silicon melt during crystal pulling. The precipitation of oxygen contained in the substrate material can form useful sites for gettering deleterious defects, contaminants and impurities.

With any gettering means, the active region of the substrate material where the devices are formed must be free of gettering sites. Thus, a zone about 5–25 microns and preferably about 10–20 microns in depth from the device surface of the wafer which is denuded of gettering sites must be created to prevent device yield loss from defect interference. The oxygen concentration in a substrate material can be reduced near the surface through outward diffusion at the process thermal conditions employed in device manufacture.

With rapidly advancing device manufacturing technology and particularly with respect to complex and lengthy processing steps and increased circuit density and total circuit size on a wafer, it has become apparent improvements are needed in the gettering capabilities of substrates to cope with the increased requirements and provide effective gettering throughout the device processing steps in order to achieve an acceptable yield of good devices per wafer.

SUMMARY OF THE INVENTION

Typical objects of this invention are to provide:

1. a semiconductor substrate having improved gettering capabilities,
2. a semiconductor substrate which provides both internal and external gettering capabilities,
3. a semiconductor substrate exhibiting enhanced gettering capabilities throughout device processing cycles, and
4. a semiconductor substrate which exhibits reduced defect formation in the active device region and provides increased minority carrier lifetime.

Other objects, characteristics and advantages of this invention will become apparent to those skilled in the art from this disclosure and appended claims.

In accordance with this invention, an improved semiconductor substrate is provided which exhibits enhanced gettering capabilities throughout device manufacturing cycles, imparts improved minority carrier lifetime and reduces yield loss of devices made due to deleterious defects, contaminants and impurities. The enhanced gettering capabilities are imparted to the semiconductor wafer through both internal means, i.e., oxygen content in the wafer and external means, i.e., applying a layer of polysilicon to the backside of the wafer.

The invention is based on a synergistic combination of gettering capability provided by the internal oxygen in the wafer and by a backside layer of polysilicon as a function of the processing temperatures which the wafers are subjected to during the device manufacturing cycles.

It has been found that the external polysilicon layer although reducing the depth of the oxygen denuded zone obtained in the wafer enhances the oxygen precipitation providing an unexpected increase in sites for gettering of impurities and an unexpected increase in minority carrier lifetime as a function of the temperatures employed in a particular device manufacturing process. The thickness of the polysilicon layer effectively controls the depth of the oxygen denuded zone formed and the degree of oxygen precipitated in the wafer. Thus, the thickness of the polysilicon layer provides a determinant for providing a sufficiently deep oxygen denuded zone and increased oxygen precipitation for effective gettering as a function of the temperatures employed in the device manufacturing processes with the resultant increase in device yield.

The synergistic gettering effect provided by the polysilicon layer is achieved when device processing temperatures do not go beyond about 1025° C. or at least beyond about 1025° C. for a sufficient period of time until the desired denuded zone is depleted of oxygen. At processing temperatures greater than 1025° C., the oxygen in the wafer generally remains in solution and does not tend to precipitate.

In low temperature device manufacturing processes, i.e., below 1025° C., the advantages of this invention to obtain a sufficient denuded zone depth, increased oxygen precipitation as gettering sites and acceptable minority carrier generation lifetimes are obtained when the thickness of the polysilicon layer on the wafer backside ranges from about 0.05 to 2.0 microns, preferably from about 0.4 to 1.2 microns, and more preferably from 0.6 to 1.0 microns. A thickness above 2.0 microns does not permit formation of a sufficient oxygen denuded zone depth for the active device region when used in the low temperature device manufacturing processes and thus permits oxygen precipitation and defect collection in the active device region.

The polysilicon layer on the wafer creates a strain resulting in a degree of bow or warpage in the wafer. The level of strain introduced is in part dependent upon the temperature at which the polysilicon layer is applied. Suitable polysilicon layers for the purpose of this invention can be deposited onto the wafers at temperatures generally within the range of 600° to 800° C. Polysilicon deposition occurs at lower temperatures, but at about 600° C. the deposition is too slow to be economically practical and deposition can occur at higher temperatures, but at about 800° C. the grain size of the polysilicon tends to become too large for effective gettering. Temperatures in the range of about 680° C.–700° C. are found to introduce the least strain to the wafer. The strain introduced to the wafer results in bow and warpage. Bow and warpage of the wafer is also proportional to the polysilicon layer thickness.

DESCRIPTION OF PREFERRED EMBODIMENTS

In the following Examples, a low pressure chemical vapor deposition (LPCVD) reactor of the type described in U.S. Pat. No. 4,309,240 is employed. A single feed gas distributing manifold extending lengthwise through the reactor and located below a wafer carrier is used. The wafer carrier employed differs from that described in U.S. Pat. No. 4,309,240 in that it is simply an elongated boat device having outwardly slanting transversely grooved sides and open at the bottom for holding a plurality of wafers on edge and parallel to each other with about 3/16 inch spacing between wafers. The reactor is operated at 690° C. unless otherwise specified. The feed is silane and is introduced at a constant rate of 300 SCCM (Standard Cubic Centimeters per Minute). The reactor is operated at a pressure of about 550 millitorr by pulling a vacuum on the system using a 26.8 CFM pump.

Silicon wafers which have been lapped and chemically etched by conventional commerical technology are used. Polysilicon layers are deposited on both sides of the wafers in the reactor. Although it is to be understood that deposition of polysilicon only on one side of the wafer is sufficient for purposes of this invention. The thickness of the polysilicon layers deposited on the wafers is controlled by regulating the deposition time in the reactor. Under the conditions employed using 3" wafers, a 0.8 micron thick layer is deposited in 35 minutes and a 1.5 micron thick layer is deposited in 65 minutes. The wafers after removal from the furnace are further processed using conventional technology. The deposited polysilicon layer is polished off the front side of the wafer leaving a polysilicon layer on the backside of the wafer.

The depth of the oxygen denuded zone formed in the wafers after being subjected to simulated device temperature cycles is measured by lapping and polishing an edge of the wafer at a shallow angle of about 11°19' to provide a test surface approximately 1 cm. in length. The polished surface is then Wright etched. Under a 100× microscope the distance L from the top level of the prepared surface to the closest precipitate is measured. The denuded zone depth (DZ) is calculated as equal to $L \sin \phi + d$ where $\phi$ is the angle of bevel and d is the thickness of the top surface removed by the Wright etch.

MOS capacitors are prepared on the candidate wafers which have been cleaned by standard techniques. A 1,000 Å thick oxide surface layer on each wafer is formed by loading the wafers into a furnace at 800° C. at 6 inches per minute in an $N_2 + 10\% \ O_2$ atmosphere, the temperature is raised to 1,000° C. at 10° per minute, oxidized in dry oxygen for 130 minutes, annealed in nitrogen for 30 minutes, reducing the temperature at 1° C. per minute to 600° C. in a nitrogen atmosphere, annealing in the presence of the forming gas for 30 minutes at 600° C. and removing from the furnace at 6 inches per minute. Capacitors are formed by conventional aluminum evaporation and photolithographic techniques. MOS lifetimes are determined from capacitance measurements as a function of time after depleting the device with an electrical pulse using the well known method of M. Zerbest [Z. Agnew Physics, 22, 30(1966)].

EXAMPLE I

A number of silicon wafers having an oxygen concentration of 30.2 PPMA (ASTM F-121-79) and a polysilicon layer on the backside prepared as described above and standard wafers, as control, are subjected to the following simulated device manufacturing temperature/atmosphere cycles.

| PUSH | TEMPERATURE °C. | TIME MINUTES | ATMOSPHERE | PULL |
|---|---|---|---|---|
| X | 900 | 45 | $O_2$ | |
| | 900 | 5 | $N_2$ | X |
| X | 800 | 45 | $N_2$ | X |
| X | 1000 | 200 | $N_2$ | X |
| X | 900 | 100 | $H_2 + O_2$ | |
| | 900 | 10 | $N_2$ | X |
| X | 1100 | 18.5 | $O_2$ | |
| | 1100 | 10 | $N_2$ | X |

The depth of the denuded zone formed near the surface of each test wafer is determined as described above and averages of the results for like test wafers are reported in Table 1.

TABLE 1

| WAFER | POLYSILICON THICKNESS (MICRONS) | DENUDED ZONE DEPTH (MICRONS) |
|---|---|---|
| A (Control) | 0 | 34 |
| B | 0.3 | 27.2 |
| C | 0.88 | 21.2 |
| D | 1.64 | 10.5 |

From the above data it is seen that at the processing conditions employed the denuded zone depth formed decreases as the polysilicon layer increases and at the greatest thickness is approaching the minimum generally desired depth for preventing precipitation of oxygen and defect formation in the active device region.

EXAMPLE II

MOS capacitors are formed on a number of silicon wafers having a polysilicon layer on the backside prepared as described above and standard wafers, as control. MOS generation lifetimes are determined as described above and the average of the results for like test wafers are reported in Table 2.

TABLE 2

| WAFER | POLYSILICON THICKNESS (MICRONS) | GENERATION LIFETIME (MILLISECONDS) |
|---|---|---|
| A (Control) | 0 | 0.5 |
| B | 0.4 | 2.8 |
| C | 0.8 | 3.1 |
| D | 1.5 | 5.2 |

From the above data it is seen that generation lifetime increases as the thickness of the polysilicon layer increases.

EXAMPLE III

A number of wafers processed as in Example I are tested for precipitation density. The wafers are cleaved to provide a cross section view and using a microscope the precipitates are counted.

The averages of results for like test wafers are given in Table 3.

TABLE 3

| WAFER | POLYSILICON THICKNESS (MICRONS) | PRECIPITATION DENSITY ($cm^{-2}$) |
|---|---|---|
| A (Control) | 0 | $2.2 \times 10^4$ |
| B | 0.3 | $1.3 \times 10^5$ |

TABLE 3-continued

| WAFER | POLYSILICON THICKNESS (MICRONS) | PRECIPITATION DENSITY ($cm^{-2}$) |
|---|---|---|
| C | 0.88 | $1.6 \times 10^5$ |
| D | 1.64 | $1.18 \times 10^6$ |

From the above data it is seen that the polysilicon layer and its thickness at the processing conditions employed has a dramatic effect on precipitation of oxygen in the wafer.

The oxygen content of semiconductor substrates has a limiting effect on this invention. When substrates having high oxygen content, i.e., about 36.2 PPMA (ASTM F-121-79) are used for applying polysilicon backside layers and tested in accordance with Examples I and III, no effective denuded zone is obtained and the oxygen precipitation is too great near the active substrate surface. Accordingly, the semiconductor substrate materials useful in this invention have an oxygen content less than about 34 PPMA.

EXAMPLE IV

A number of silicon wafer having varying oxygen contents and a polysilicon layer on the backside prepared as described above with standard wafers, as control, are subjected to the following temperature/atmospheric conditions repeated three times.

| PUSH | TEMPERATURE °C. | TIME | ATMOSPHERE | PULL |
|---|---|---|---|---|
| X | 800 | | | |
| | 1050 | 4 hours | $N_2 + 10\% O_2$ | |
| | 800 | | | X |

The depth of the denuded zone formed near the surface of the wafer is determined as described above and the results for like test wafers are given in Table 4.

TABLE 4

| WAFER | $O_2$ CONTENT PPMA* | POLYSILICON THICKNESS (MICRONS) | DENUDED ZONE DEPTH (MICRONS) |
|---|---|---|---|
| A (Control) | 36.7 | 0 | 5.3 |
| B | 36.7 | 0.3 | 5.3 |
| C | 36.7 | 0.87 | 5.4 |
| D | 36.7 | 1.62 | 5.0 |
| E | 30.3 | 0 | 6.7 |
| F | 30.3 | 0.28 | 7.0 |
| G | 30.3 | 0.85 | 7.9 |
| H | 30.3 | 1.6 | 6.5 |

*ASTM F-121-79

From the above data it is seen that the polysilicon layer thickness has substantially no effect on altering the oxygen denuded zone depth when the processing temperatures are above about 1025° C. as used in the high temperature device manufacturing processes.

The above Examples used standard P<100> type silicon wafers. However, polysilicon layers on any crystalline P or N type wafer provide improved gettering of deleterious defects, contaminants and impurities. Typical gettering improvements from polysilicon backside layers as indicated by generation lifetime will be at least about 4 times that of standard P<100> type wafers and at least about 1.5 times that of standard P<111> type wafers.

This invention, in addition to providing the Electronics industry an improved semiconductor substrate, permits control of semiconductor substrate characteristics such as denuded zone depth and oxygen precipitation through polysilicon backside layer thickness in relation to the specific requirements dictated by downstream needs and manufacturing conditions, such as particular device requirements and processing temperatures.

Although the foregoing description has emphasized gettering improvement for low temperature device manufacturing processes with reference to specific embodiments, it has been found that the use of a polysilicon layer on the backside of a semiconductor substrate provides an improved substrate free of surface defects, contaminants and impurities useful in epitaxial deposition of coatings, such as silicon, onto the semiconductor substrate. It is therefore to be understood that changes and modifications in form and detail of the invention and specific utilization thereof may be made without departing from the spirit and scope of the invention and appended claims.

What is claimed is:

1. A semiconductor substrate useful in electronic device manufacturing processes utilizing initial processing temperatures at 1025 C. or below and having capability for gettering defects, contaminants and impurities deleterious to the devices to a region away from the active device region, consisting essentially of a semiconductor material having an oxygen content less than about 34 ppma (ASTM F-121-79) and a 0.05 to 2.0 micron thick layer of polysilicon on the substrate backside from the device region.

2. The substrate of claim 1 wherein the thickness of said polysilicon layer is from 0.4 to 1.2 microns.

3. The substrate of claim 1 wherein the thickness of said polysilicon layer is from 0.6 to 1.0 microns.

4. The substrate of claim 1 wherein semiconductor material is silicon.

5. The substrate of claim 1 wherein said polysilicon layer is applied to said semiconductor material by chemical vapor deposition of a silicon containing material.

6. The substrate of claim 5 wherein said silicon containing material is silane.

7. A semiconductor substrate, useful in device manufacturing processes utilizing initial processing temperatures at 1025 C. or below and having capability for gettering defects, contaminants and impurities deleterious to the devices to a region away from the active device region, consisting essentially of a silicon wafer having one mirror-like surface, an oxygen content less than about 34 ppma (ASTM F-121-79) and a 0.4 to 1.12 micron thick layer of polysilicon covering the other surface.

8. The substrate of claim 7 wherein said layer is from 0.6 to 1.0 micron thick.

9. The substrate of claim 7 wherein said polysilicon layer is applied to said semiconductor material by low pressure chemical vapor deposition of silane.

10. In a process of manufacturing electronic devices wherein the devices are formed, using initial processing temperatures at 1025 C. or below, on one surface of a substrate consisting essentially of a semiconductor material having a backside layer of polysilicon, the improvement wherein the oxygen content in the semiconductor material is less than about 34 ppma (ASTM F-121-79) and the layer of polysilicon has a thickness from 0.05 to 2.0 microns.

11. In the process of claim 10 wherein said thickness is from 0.4 to 1.2 microns.

12. In the process of claim 10 wherein said thickness is from 0.6 to 1.0 micron.

13. In the process of claim 10 wherein said semiconductor material is silicon.

14. The method for controlling the denuded zone depth and the oxygen precipitation in a semiconductor substrate having an oxygen content less than about 34 ppma (ASTM F-121-79) comprising regulating the thickness of a layer consisting essentially of polysilicon applied to the backside of the semiconductor substrate.

15. The method of claim 14 wherein said polysilicon layer thickness is regulated from about 0.05 to 2.0 microns.

16. The method of claim 14 wherein said polysilicon layer thickness is regulated from about 0.4 to 1.2 microns.

17. The method of claim 14 wherein said polysilicon layer thickness is regulated from about 0.6 to 1.0 micron.

* * * * *